(12) United States Patent
Van Schoot et al.

(10) Patent No.: US 7,816,658 B2
(45) Date of Patent: Oct. 19, 2010

(54) EXTREME ULTRA-VIOLET LITHOGRAPHIC APPARATUS AND DEVICE MANUFACTURING METHOD

(75) Inventors: Jan Bernard Plechelmus Van Schoot, Eindhoven (NL); Johannes Hubertus Josephina Moors, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 198 days.

(21) Appl. No.: 11/808,264

(22) Filed: Jun. 7, 2007

(65) Prior Publication Data

US 2008/0302980 A1    Dec. 11, 2008

(51) Int. Cl.
*G21K 1/10* (2006.01)

(52) U.S. Cl. .................... 250/504 R; 250/492.1; 250/492.23; 355/67

(58) Field of Classification Search ............ 250/504 R, 250/492.1, 492.2, 492.22, 493.1, 492.21, 250/492.23, 492.3, 503.1; 430/30, 296; 355/30, 355/53, 55, 67, 77; 378/34, 51, 56
See application file for complete search history.

(56) References Cited

U.S. PATENT DOCUMENTS

| | | | | |
|---|---|---|---|---|
| 4,018,241 | A | * | 4/1977 | Sodal et al. .................. 137/14 |
| 5,229,872 | A | | 7/1993 | Mumola ........................ 349/2 |
| 5,296,891 | A | | 3/1994 | Vogt et al. .................... 355/67 |
| 2003/0053594 | A1 | * | 3/2003 | Fornaciari et al. ........... 378/119 |
| 2004/0160583 | A1 | * | 8/2004 | Mulkens et al. .............. 355/30 |
| 2007/0080307 | A1 | * | 4/2007 | Bruijn et al. ............ 250/504 R |

FOREIGN PATENT DOCUMENTS

| | | |
|---|---|---|
| EP | 0 952 491 A2 | 10/1999 |
| EP | 1 160 627 A2 | 12/2001 |
| EP | 1 160 627 A3 | 8/2004 |
| EP | 1 491 959 A1 | 12/2004 |
| EP | 1 596 252 A1 | 11/2005 |

OTHER PUBLICATIONS

International Preliminary Report on Patentability for International Application No. PCT/NL2008/050355 dated Dec. 17, 2009.
International Search Report for International Application No. PCT/NL2008/050355 dated Oct. 24, 2008.

* cited by examiner

*Primary Examiner*—Jack I Berman
*Assistant Examiner*—Nicole Ippolito Rausch
(74) *Attorney, Agent, or Firm*—Pillsbury Winthrop Shaw Pittman LLP

(57) ABSTRACT

An extreme ultra-violet lithographic apparatus for imaging a pattern onto a substrate includes a radiation system constructed and arranged to provide a beam of an extreme ultra-violet radiation, and an absorber arranged in the beam and constructed and arranged to absorb at least a portion of the radiation beam. The absorber has a volume configured to accommodate a flow of an absorbing gas. The flow is directed in a transverse direction with respect to the beam. The absorber includes a structure having an extreme ultra-violet radiation-transmissive beam entry area and an extreme ultra-violet radiation-transmissive beam exit area. The apparatus also includes a gas inlet actuator array configured to inject the gas into the volume and a gas outlet actuator array arranged to evacuate the gas from the volume.

19 Claims, 5 Drawing Sheets

EXTREME ULTRA-VIOLET LITHOGRAPHIC APPARATUS AND DEVICE MANUFACTURING METHOD

FIELD

The invention relates to an extreme ultra-violet (EUV) lithographic apparatus comprising an absorber and a device manufacturing method using the same.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. Examples of suitable patterning device include:

A mask. The concept of a mask is well known in lithography, and it includes mask types such as binary, alternating phase shift, and attenuated phase-shift, as well as various hybrid mask types. Placement of such a mask in a radiation beam causes selective transmission (in case of a transmissive mask) or reflection (in case of a reflective mask) of the radiation impinging on the mask, according to the pattern of the mask. In the case of the mask, the mask support structure will generally be a mask table, which ensures that the mask can be held at a desired position in the incoming radiation beam, and that it can be moved relative to the beam if so desired.

A programmable mirror array. An example of such a device is a matrix-addressable surface having viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. The matrix addressing can be performed using a suitable electronic device. Suitable examples of mirror arrays are known from U.S. Pat. No. 5,296,891, for example, which is incorporated herein by reference. The programmable mirror array may be embodied as a frame or table, for example, which may be fixed or movable as desired.

A programmable LCD array. An example of such a construction is given in U.S. Pat. No. 5,229,872, which is incorporated herein by reference. As above, the support structure in this case may be embodied as a frame or table, for example, which may be fixed or movable as desired.

A suitable pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

It is desirable to provide an EUV lithographic apparatus that is configured to provide suitable modulation of the beam intensity profile.

According to an aspect of the invention there is provided an extreme ultra-violet lithographic apparatus for imaging a pattern onto a substrate includes a radiation system constructed and arranged to provide a beam of an extreme ultra-violet radiation, and an absorber arranged in the beam and constructed and arranged to absorb at least a portion of the radiation beam. The absorber has a volume configured to accommodate a flow of an absorbing gas. The flow is directed in a transverse direction with respect to the beam. The absorber includes a structure having an extreme ultra-violet radiation-transmissive beam entry area and an extreme ultra-violet radiation-transmissive beam exit area. The apparatus also includes a gas inlet actuator array configured to inject the gas into the volume and a gas outlet actuator array arranged to evacuate the gas from the volume.

According to another aspect of the invention there is provided a device manufacturing method that includes patterning an extreme ultra-violet radiation beam, projecting the patterned radiation beam onto a target portion of a substrate, and controlling an intensity of the radiation beam with an absorber arranged in the beam by absorbing at least a portion of the radiation beam as the radiation beam passes through the absorber. The absorber has a volume accommodating a transverse flow of an absorbing gas with respect to the beam.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
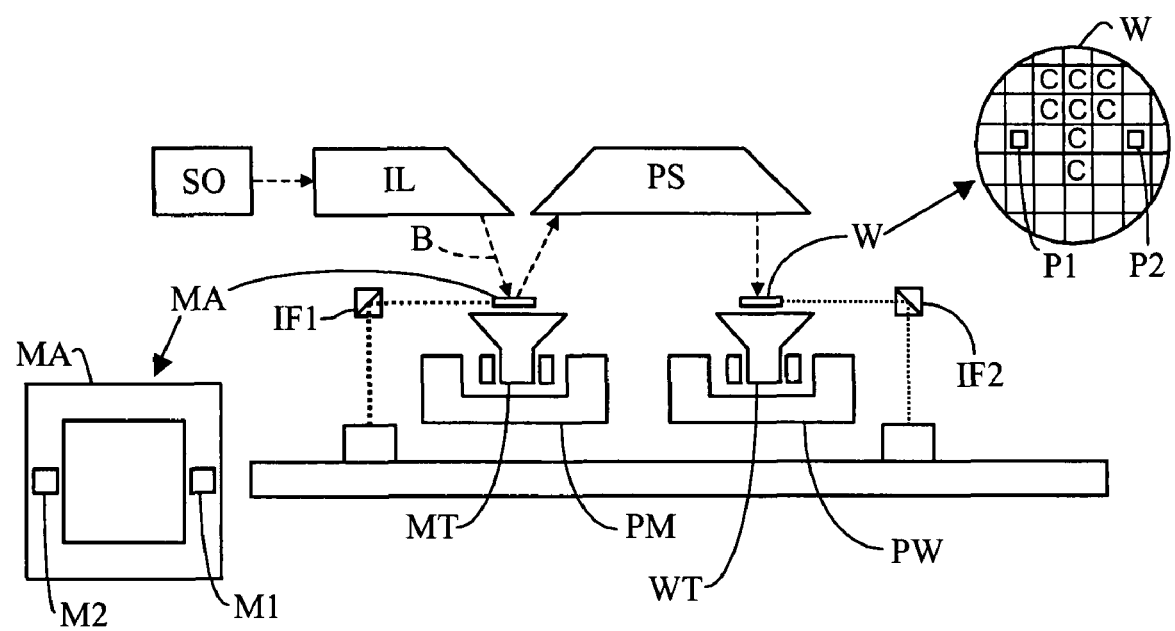
FIG. 1 depicts a lithographic apparatus according to an embodiment of the invention.

FIG. 1 schematically depicts a lithographic apparatus according to an embodiment of the invention. The apparatus comprises: an illumination system (illuminator) IL configured to condition a radiation beam B, for example, the EUV radiation; a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by the patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. As discussed above, masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if needed, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
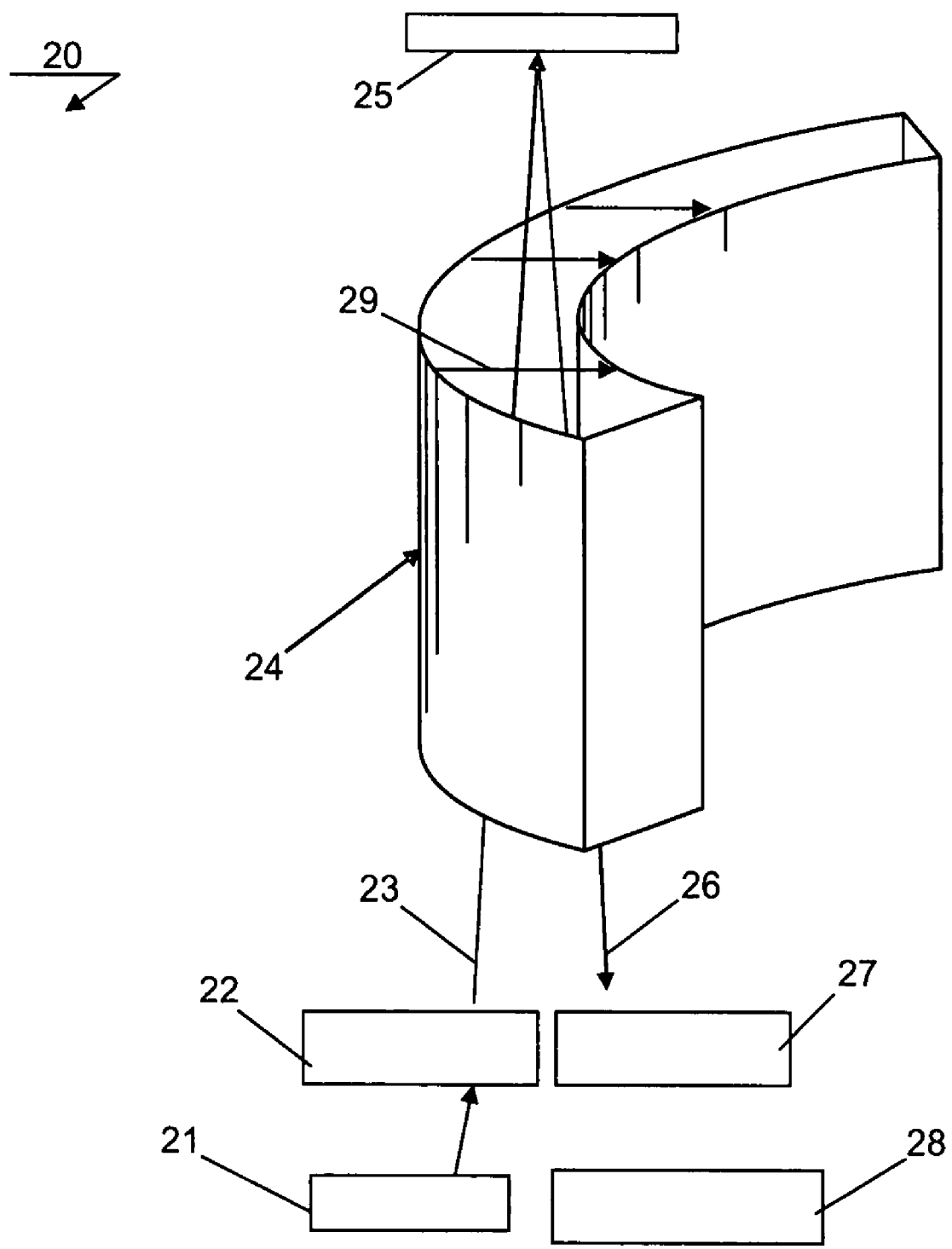
FIG. 2 depicts an embodiment of the lithographic apparatus of FIG. 1 provided with an absorber.

FIG. 2 depicts an embodiment of a lithographic apparatus 20 provided with an absorber 24. The lithographic apparatus 20 comprises a source 21 arranged to generate a beam of EUV radiation. The source 21 may comprise, for example, a laser-produced plasma source, or a discharge plasma source. The beam of EUV radiation emanating from the source 21 is conditioned by an illumination system 22, after which the beam 23 is traversing the absorber 24 comprising a flowing absorber gas 29. The beam 23 is subsequently patterned using a patterning device 25. The patterning device may comprise a mask, a controllable mirror array on an LCD array, as is described in the foregoing. The patterned beam 26 traverses the absorber 24 after which the beam 26 enters the projection system 27 arranged to project the patterned beam onto a target portion of a substrate 28. The absorber 24 comprises an EUV-transmissive beam entry area and an EUV-transmissive beam exit area. It should be understood that the EUV-transmissive area contemplates at least 50% transmission. The absorber 24 may comprise a thin film configured to substantially seal its internal volume. Alternatively, the absorber 24 may be arranged as an open structure with respect to the beam path. The absorber 24 is arranged to generate a desired concentration profile of the absorbing gas 29 in the volume of the absorber. Any gas absorbing EUV radiation is suitable to be used for absorbing gas 29. For example, the gas may comprise any noble gas, such as He, Ne, Ar, Kr, or Xe, or may comprise gaseous hydrocarbons, $CH_4$, $N_2$, $O_2$, or $H_2$. The absorbing gas is substantially transversely arranged with respect to the beam. The term transversely comprises any inclination greater than 0 degrees. For this purpose, the absorber 24 cooperates with a gas inlet actuator array and a gas outlet actuator array, which are described in more detail with reference to FIG. 3. The absorber 24 may comprise a tubular structure, which may allow individual elements of the gas inlet array to be substantially equidistantly arranged with the individual elements of the gas outlet array. A non-uniform concentration distribution may be generated in the volume of the absorber 24, which may compensate for a variety of operating parameters. For example, an intensity of the beam 23 may be non-uniform. The absorber 24 may be arranged to compensate for any non-desired intensity profile of the beam 23. Second, the patterning device 25 may have non-uniform characteristics. For example, if a mask is selected for the patterning device, the geometry or reflective or transmissive material properties may be non-uniform. The absorber 24 may be constructed to compensate for such non-uniformity. The mask non-uniformity may be known a-priori. Alternatively, in case when the patterning device comprises a mirror array, the controllability of the individual mirrors constituting the array may be non-uniform. The gas inlet actuator array and/or the gas outlet actuator array may by arranged to compensate for such non-uniformity. Third, the substrate 28 may be non-uniform due to the substrate processing steps, like priming, resist coating and a soft bake. The absorber 24 may be arranged to compensate for the non-homogeneity of the substrate 28. After the beam 26 is suitably handled by the projection system 27, it is used to image the pattern on the substrate 28.

The absorber 24 may be arranged in the beam path between the illuminator module 22 and the patterning device 25 so that the beam 23 traverses the absorber 24 only once and prior to interaction with the beam patterning device 25. This arrangement of the absorber 24 may allow the beam being conditioned by the patterning device 25 to not be affected by the absorber 24. Suitable gasses to be used in the absorber 24 are krypton, xenon, argon neon, helium, hydrogen, oxygen, nitrogen, gaseous hydrocarbons, $CH_4$, noble gasses, etc. Krypton has an interaction length of 80 mm for 90% at a pressure of 0.01 mbar. Xenon has an interaction length of 1.7 mm or 90% transmission is 1.7 mm at the pressure of 0.1 mbar, or 17 mm at pressure of 0.01 mbar. A higher pressure gradient may be used when comparing the volume of the absorber 24 and the ambient pressure of the lithographic apparatus, the latter being about 0.1 mbar. For example, hydrogen gas may be used in the absorber 24, as this gas has a much lower absorption than that of krypton and xenon.

Figure 3:
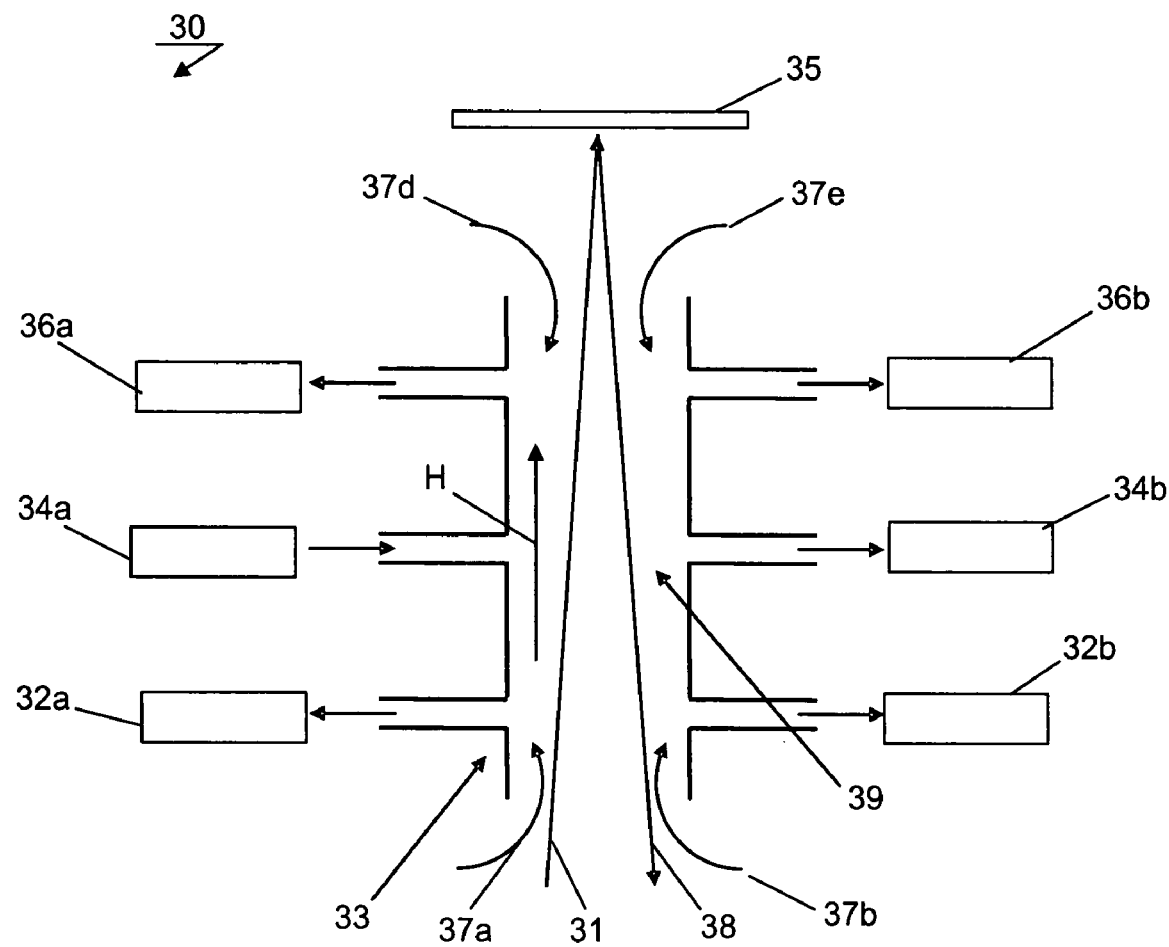
FIG. 3 depicts schematically a cross-section of the absorber shown in FIG. 2.

FIG. 3 schematically depicts a cross-section of the absorber shown in FIG. 2. FIG. 3 shows schematically a portion of the lithographic apparatus 30 comprising an absorber 33 and a patterning device 35. Although in this arrangement the beam 31, 38 passes twice through the absorber 33, it will be appreciated that the absorber 33 may be arranged in the beam path between the illuminator module (not shown) and the patterning device 35 so that the beam 31 passes the volume of the absorber 33 only once, and the patterned beam 38 propagates freely to the projection module (not shown). The absorber 33 comprises a gas inlet actuator array 34a and a gas outlet actuator array 34b, the former being arranged to inject a suitable gas 39 (krypton, xenon, hydrogen, or the like) into the volume of the absorber 33 substantially transverse to a direction of the beam path 31, 38 in the absorber 33. The gas outlet actuator array 34b is arranged to evacuate the gas from the volume of the absorber 33, preferably so that an intensity profile along a direction H of the absorber given by the gas inlet actuator array 34a is not modified. For this purpose, the gas evacuation power of the gas outlet actuator array 34b is may be selected to be equal or greater than the gas supply power of the gas inlet actuator array. The gas 39 may be confined to the volume of the absorber 33. For this purpose, the absorber 33 may comprise a first pumping arrangement 32a, 32b and a second pumping arrangement 36a, 36b, the volume of the absorber comprising the gas 39 being located between the first pumping arrangement 32a, 32b and the second pumping arrangement 36a, 36b. The first pumping arrangement and the second pumping arrangement are constructed to evacuate the gas, thereby substantially providing a vacuum seal for the volume of the absorber 33. The first pumping arrangement and the second pumping arrangement may be constructed to produce a lower pressure than the ambient pressure of the lithographic apparatus so that gas in areas 37a, 37b, 37d, 37e is carried away by the first pumping arrangement and the second pumping arrangement. This may counteract contamination of the ambient atmosphere of the lithographic apparatus 30 by the gas of the absorber 33, thereby improving working characteristics of the lithographic apparatus.

Figure 4:
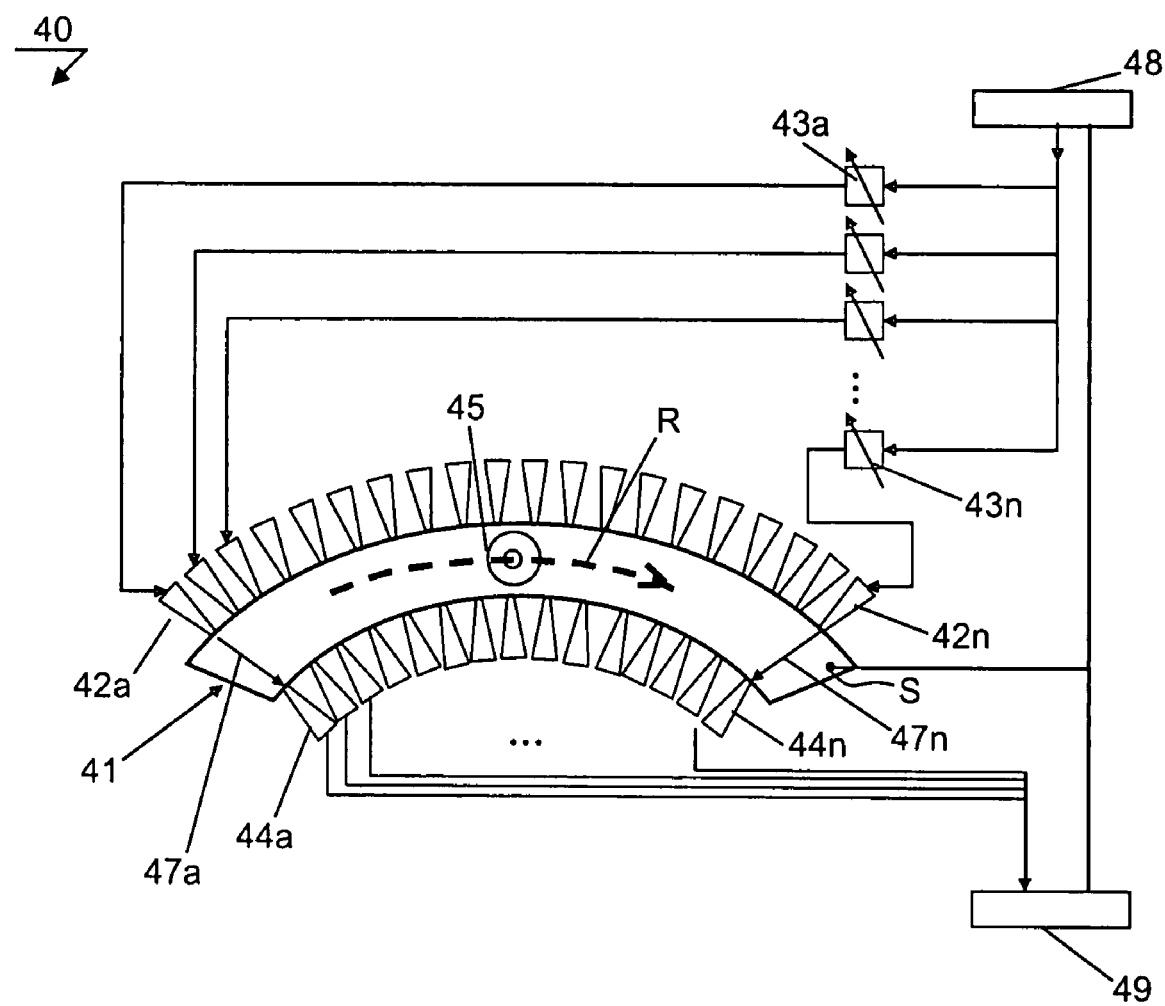
FIG. 4 depicts a gas supply scheme of the absorber shown in FIG. 2.

FIG. 4 depicts a gas supply scheme of the absorber shown in FIG. 2. The arrangement 40 comprises an absorber 41, which is shown in a transverse cross-section, the incoming beam of radiation being schematically illustrated by item 45. The absorber 41 comprises an open structure providing an unobstructed beam entry area and beam exit area. A transverse gas flow 47a, ..., 47n is generated in the volume of the absorber 41 with a gas inlet actuator array 43a, ..., 43n, and a gas outlet actuator array 44a, ..., 44n, which may include outlet pumps. The gas inlet actuator array may comprise supersonic jets. The gas inlet actuator array is controlled by an inlet control unit (controller) 48 and the gas outlet actuator array is controlled by an outlet control unit (controller) 49. The inlet control unit 48 and the outlet control unit 49 are preferably arranged to control the inlet jets 42a, ..., 42n and the outlet pumps 44a, ..., 44n individually so that a desired homogeneous or non-homogeneous profile along a direction R of the absorber may be obtained. A sensor S may be provided to measure a gas concentration in at least one portion of the volume of the absorber, and the inlet control unit 48 and/or outlet control unit 49 may be constructed and arranged to be responsive to the sensor S, and to control the gas inlet actuator array 43a, ..., 43n or the gas outlet actuator array 44a, ..., 44n accordingly.

Figure 5:
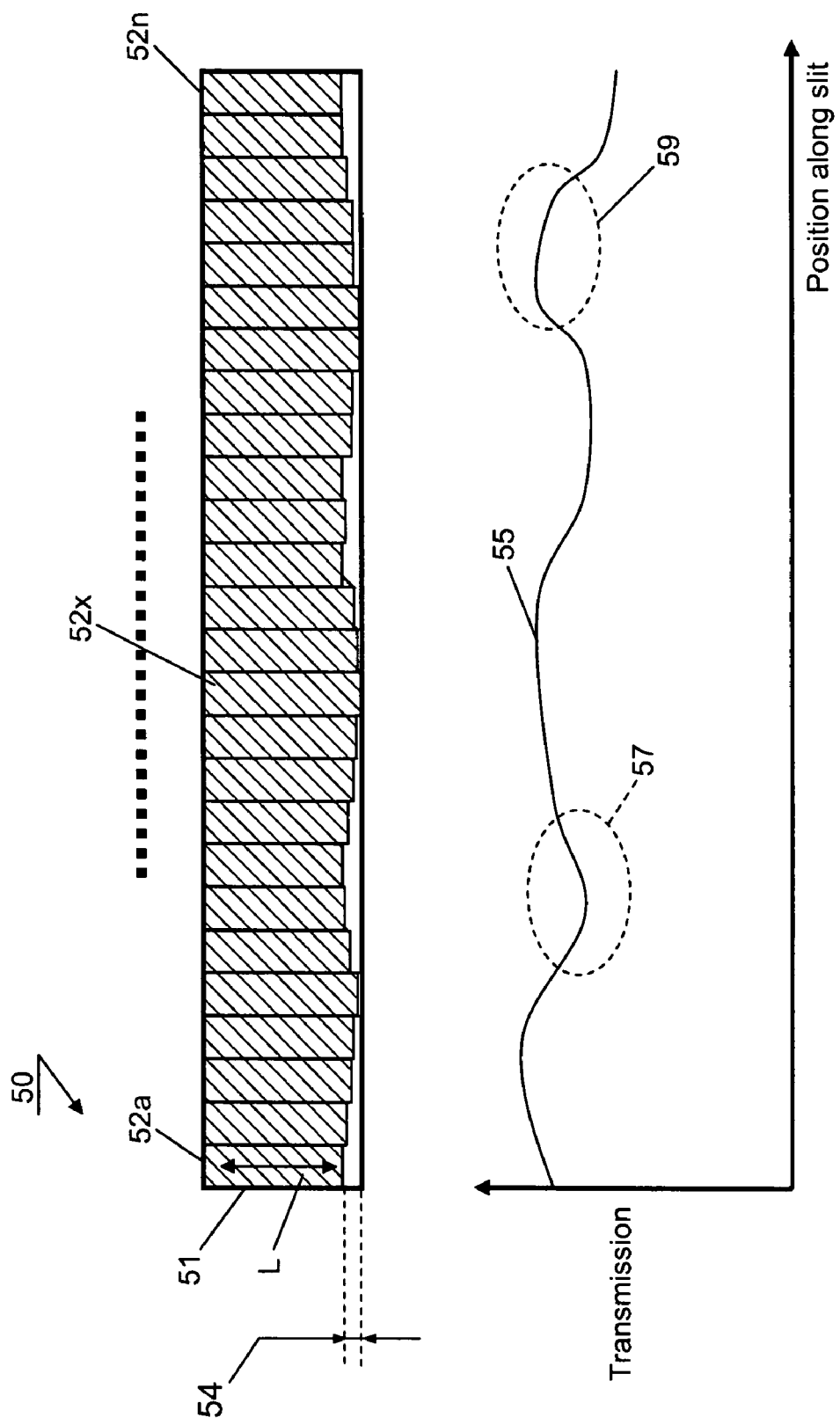
FIG. 5 depicts an embodiment of an actuator array and a resulting distribution of the absorbing gas in the volume of the absorber.

FIG. 5 depicts an embodiment of an actuator array and a resulting distribution of the absorbing gas in the volume of the absorber. Arrangement 50 presents a front view of the gas inlet actuator array comprising a plurality of displaceable elements, such as piezo elements, 52a, ..., 52n. The elements 52a, ..., 52n are arranged in a suitable enclosure 51. Each element is displaceable in a direction indicated by arrow L. A maximum gas supply is provided when an element is retracted having a maximum opening 54. In order to reduce a gas supply from the element, the element may be fully extended to a position, like indicated by an item 52x. By controlling all individually displaceable elements 52a, ..., 52n, a desired transmission profile 55 along a direction R (FIG. 4) may be obtained. It is schematically indicated that for areas with an increased gas supply, the resulting transmission may be reduced (see area 57), whereas for region with reduced gas supply, the resulting transmission may be increased (see area 59).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass extreme ultra-violet (EUV) radiation (e.g. having a wavelength in the range of about 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An extreme ultra-violet lithographic apparatus for imaging a pattern onto a substrate, said apparatus comprising:
   a radiation system constructed and arranged to provide a beam of an extreme ultra-violet radiation;
   an absorber arranged in the beam and constructed and arranged to absorb at least a portion of the extreme ultra-violet radiation in the beam of the extreme ultra-violet radiation, said absorber comprising a structure defining an internal volume configured to accommodate a flow of an absorbing gas, the flow being directed in a transverse direction with respect to the beam, said structure having an extreme ultra-violet radiation-transmissive beam entry area and an extreme ultra-violet radiation-transmissive beam exit area; and
   a gas inlet actuator array configured to inject said gas into the internal volume of the absorber and a gas outlet actuator array arranged to evacuate the gas from the internal volume of the absorber,
   wherein said absorber further comprises a first pump unit and a second pump unit, the gas inlet actuator array and the gas outlet actuator array being located between said first pump unit and said second pump unit along the beam path, said first pump unit and said second pump unit being arranged to substantially prevent the absorbing gas from escaping into an atmosphere of the lithographic apparatus by providing, in use, a vacuum seal for the internal volume of the absorber.

2. The extreme ultra-violet lithographic apparatus according to claim 1, wherein an evacuation capacity of the gas outlet actuator array is at least equal to a supply capacity of the gas inlet actuator array.

3. The extreme ultra-violet lithographic apparatus according to claim 1, wherein the structure is arranged as an open structure with respect to the beam entry area and the beam exit area.

4. The extreme ultra-violet lithographic apparatus according to claim 1, further comprising:
   an illumination system configured to condition the radiation beam;
   a patterning device configured to impart the radiation beam with a pattern in its cross-section to form a patterned radiation beam,
   wherein the absorber is positioned in a beam path between the illumination system and the patterning device.

5. The extreme ultra-violet lithographic apparatus according to claim 1, wherein the gas inlet actuator array comprises a plurality of individually adjustable elements configured to selectively control gas concentration in a vicinity of the said elements.

6. The extreme ultra-violet lithographic apparatus according to claim 5, wherein the adjustable elements comprise piezo elements constructed and arranged to selectively obstruct a portion of an area of the gas inlet actuator array.

7. The extreme ultra-violet lithographic apparatus according to claim 1, wherein the gas is selected from a group consisting of krypton, xenon, argon neon, helium, hydrogen, oxygen, and nitrogen.

8. The extreme ultra-violet lithographic apparatus according to claim 1, wherein said gas inlet actuator array and/or said gas outlet actuator array is arranged to generate a non-uniform distribution of gas concentration in a cross-section of the absorber, the distribution extending in a direction substantially perpendicular to the beam path.

9. The extreme ultra-violet lithographic apparatus according to claim 1, further comprising:
 a sensor constructed and arranged to measure a gas concentration in at least one portion of the internal volume of the absorber; and
 a controller constructed and arranged to be responsive to said sensor, and to control the gas inlet actuator array or the gas outlet actuator array.

10. The extreme ultra-violet lithographic apparatus according to claim 1, wherein the gas inlet actuator array comprises supersonic jets.

11. The extreme ultra-violet lithographic apparatus according to claim 1, wherein said structure is a tubular structure.

12. The extreme ultra-violet lithographic apparatus according to claim 1, wherein the extreme ultra-violet radiation has a wavelength in the range of about 5-20 nm.

13. A device manufacturing method comprising:
 patterning an extreme ultra-violet radiation beam;
 projecting the patterned radiation beam onto a target portion of a substrate;
 controlling an intensity of the radiation beam with an absorber arranged in the beam by absorbing at least a portion of the extreme ultra-violet radiation in the extreme ultra-violet radiation beam as the radiation beam passes through the absorber, said absorber comprising a structure defining an internal volume accommodating a transverse flow of an absorbing gas with respect to the beam; and
 evacuating the absorbing gas from the internal volume of the absorber with a first pump unit and a second pump unit positioned downstream of the first pump unit with respect to the propagation of the radiation beam to substantially prevent the absorbing gas from escaping the absorber by creating a vacuum seal for the internal volume of the absorber.

14. The device manufacturing method according to claim 13, wherein the absorbing gas is evacuated from the internal volume of the absorber with a capacity at least equal to a capacity of injection of the gas into the internal volume of the absorber.

15. The device manufacturing method according to claim 13, wherein the absorber is positioned in the beam between a illumination module and a beam patterning device.

16. The device manufacturing method according to claim 13, further comprising:
 controlling a gas concentration in a vicinity of a plurality of individually adjustable elements.

17. The device manufacturing method according to claim 13, wherein the gas is selected from a group consisting of krypton, xenon, argon neon, helium, hydrogen, oxygen, and nitrogen.

18. The device manufacturing method according to claim 13, further comprising generating a non-uniform distribution of the gas concentration in a cross-section of the absorber transverse to the beam.

19. The device manufacturing method according to claim 13, wherein the method further comprises:
 measuring a gas concentration in at least one portion of the internal volume of the absorber; and
 controlling a gas inlet actuator array and/or a gas outlet actuator array in response to said measuring.

* * * * *